(12) United States Patent
Jiang et al.

(10) Patent No.: US 10,217,773 B2
(45) Date of Patent: Feb. 26, 2019

(54) ARRAY SUBSTRATE AND FABRICATION METHOD THEREOF, DISPLAY PANEL AND FABRICATION METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Jingjing Jiang, Beijing (CN); Gyuhyun Lee, Beijing (CN); Min Li, Beijing (CN); Song Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 254 days.

(21) Appl. No.: 14/359,006

(22) PCT Filed: Apr. 26, 2013

(86) PCT No.: PCT/CN2013/074790
§ 371 (c)(1),
(2) Date: May 16, 2014

(87) PCT Pub. No.: WO2014/131238
PCT Pub. Date: Sep. 4, 2014

(65) Prior Publication Data
US 2015/0085216 A1    Mar. 26, 2015

(30) Foreign Application Priority Data
Feb. 28, 2013    (CN) .......................... 2013 1 0064151

(51) Int. Cl.
*G02F 1/136* (2006.01)
*H01L 27/12* (2006.01)
(Continued)

(52) U.S. Cl.
CPC ........ *H01L 27/1248* (2013.01); *G02F 1/1368* (2013.01); *G02F 1/133512* (2013.01);
(Continued)

(58) Field of Classification Search
CPC ... G02F 1/136209; G02F 2001/133357; H01L 29/8633; H01L 27/1248
See application file for complete search history.

(56) References Cited

U.S. PATENT DOCUMENTS 5,854,663 A * 12/1998 Oh ..................... G02F 1/136209
349/106
6,118,505 A *  9/2000 Nagata .............. G02F 1/136209
349/106
(Continued)

FOREIGN PATENT DOCUMENTS

CN    101533191 A    9/2009
CN    102236228 A    11/2011

OTHER PUBLICATIONS

Second Chinese Office Action Appln. No. 201310064151.9; dated Apr. 15, 2015.
(Continued)

*Primary Examiner* — Paisley L Arendt
(74) *Attorney, Agent, or Firm* — Ladas & Parry LLP

(57) ABSTRACT

Embodiments of the disclosure provide an array substrate and a fabrication method thereof, and a display panel and a fabrication method thereof. A passivation layer of the array substrate is made of a black insulation material and the passivation layer is provided with an opening at a pixel display region of the array substrate. The passivation layer is simultaneously used as a black matrix, and thus the aperture ratio of the display panel is effectively increased.

18 Claims, 4 Drawing Sheets

(51) Int. Cl.
*G02F 1/1368* (2006.01)
*H01L 29/786* (2006.01)
*G02F 1/1362* (2006.01)
*G02F 1/1335* (2006.01)
*G02F 1/1333* (2006.01)

(52) U.S. Cl.
CPC .... *G02F 1/136209* (2013.01); *H01L 27/1262* (2013.01); *H01L 29/78633* (2013.01); *G02F 2001/133357* (2013.01)

(56) References Cited

U.S. PATENT DOCUMENTS

| | | | |
|---|---|---|---|
| 7,483,009 B2* | 1/2009 | Tsubata | G02F 1/136209 345/87 |
| 8,199,302 B2* | 6/2012 | Hong | G02F 1/134363 349/106 |
| 8,248,568 B2* | 8/2012 | Anjo | G02F 1/134363 349/139 |
| 2001/0048490 A1 | 12/2001 | Lim et al. | |
| 2009/0256984 A1* | 10/2009 | Lee | G02F 1/136209 349/43 |
| 2011/0273651 A1 | 11/2011 | Kim et al. | |
| 2012/0241746 A1* | 9/2012 | Xie | H01L 27/1248 257/59 |

OTHER PUBLICATIONS

First Chinese Office Action dated Dec. 2, 2014; Appln. No. 201310064151.9.
International Preliminary Report on Patentability dated Sep. 1, 2015; PCT/CN2013/074790.
International Search Report dated Dec. 19, 2013; PCT/CN2013/074790.

* cited by examiner

ARRAY SUBSTRATE AND FABRICATION METHOD THEREOF, DISPLAY PANEL AND FABRICATION METHOD THEREOF

TECHNICAL FIELD

Embodiments of the disclosure relate to an array substrate and a fabrication method of an array substrate, and a display panel and a fabrication method of a display panel.

BACKGROUND

Thin film transistor liquid crystal display (TFT-LCD) dominates the display market. According to one technique, the TFT-LCD comprises an array substrate, an opposite substrate and a liquid crystal layer provided between the array substrate and the opposite substrate.

A structure of the opposite substrate is shown in FIG. 1 (a)-FIG. 1 (b). As shown in FIG. 1 (a)-FIG. 1 (b), the opposite substrate comprises a base substrate 141, a black matrix 142, a color filter layer 143 (for example, comprising a red filter unit 143R, a green filter unit 143G, and a blue filter unit 143B), and a columnar spacer 150. The black matrix 142 prevents light leakage between pixels and prevents color mixture so as to increase color purity and color contrast.

A structure of the array substrate (i.e. TFT substrate) is shown in FIG. 2. As shown in FIG. 2, the array substrate comprises a base substrate 111, and a plurality of gate lines and a plurality of data lines formed on the base substrate 111. The plurality of gate lines and the plurality of data lines intersect with each other to define a plurality of pixel units. Each pixel unit comprises a pixel electrode 130 and a thin film transistor. The thin film transistor comprises a gate electrode 112, a gate insulation layer 113, an active layer, a source electrode 116 and a drain electrode 117 that are formed on the base substrate 111. The active layer comprises a semiconductor layer 114 and a doped semiconductor layer 115. The array substrate further comprises a transparent protection layer 118, and the pixel electrode 130 is connected with the drain electrode 117 through a via hole 119 penetrating through the transparent protection layer 118.

The array substrate and the opposite substrate are bonded with each other, and the black matrix on the opposite substrate covers the gate line, the data line and the thin film transistor on the array substrate. Light leakage may occur at an edge of the pixel unit due to misalignment of the array substrate and the opposite substrate. Thus, the black matrix has to be widened, which however results in a decrease of the aperture ratio.

SUMMARY

In some embodiments, an array substrate is provided. A passivation layer of the array substrate is made of a black insulation material and the passivation layer is provided with an opening at a pixel display region of the array substrate.

In some embodiments, a display panel is provided. The display panel comprises the above-described array substrate.

In some embodiments, a fabrication method of an array substrate is provided. The method comprises: forming a thin film transistor, a gate line, and a data line on a base substrate; and forming a black insulation material film on the base substrate, and forming a passivation layer by a patterning process. The passivation layer is provided with an opening at a pixel display region.

In some embodiments, a fabrication method of a display panel is provided. The method comprises a fabrication method of an array substrate as described above and a fabrication method of an opposite substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
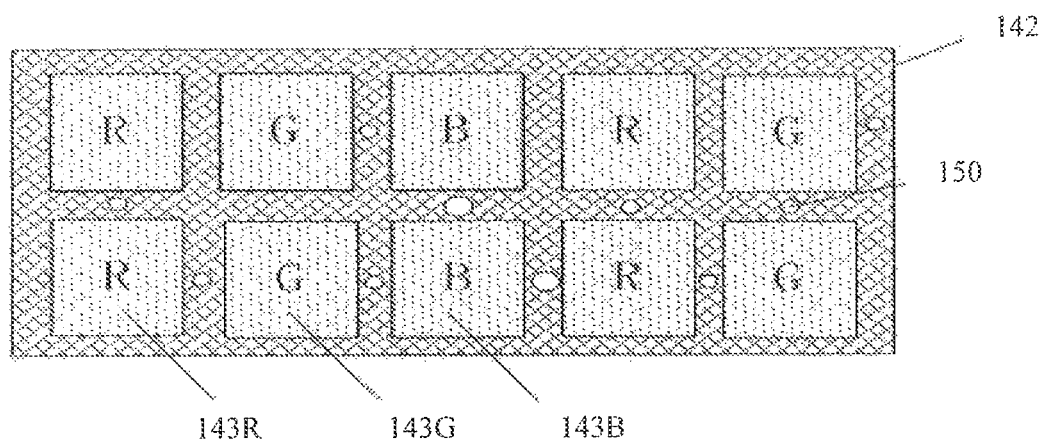
FIG. 1 (a)-FIG. 1 (b) are respectively a plan view and a sectional view illustrating an opposite substrate according to one technique.
Figure 1:
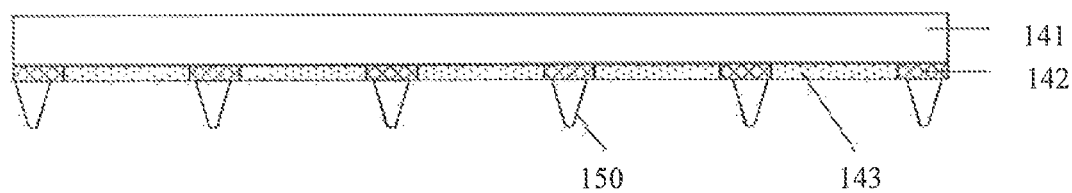
Figure 2:
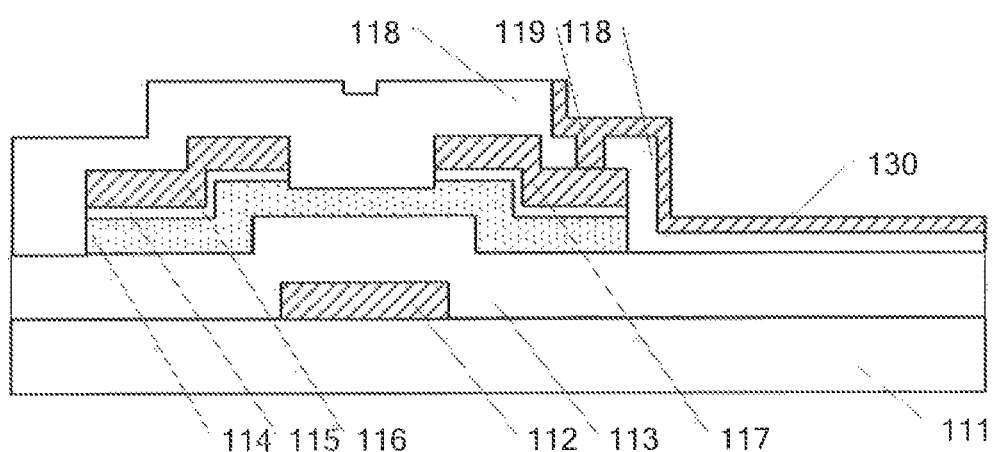
FIG. 2 is a sectional view illustrating an array substrate according to one technique.
Figure 3:
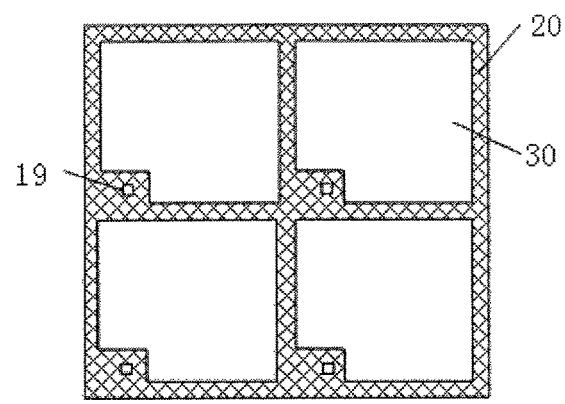
FIG. 3 (a)-FIG. 3 (b) are respectively a plan view and a sectional view illustrating an array substrate according to some embodiments of the disclosure.
Figure 3:
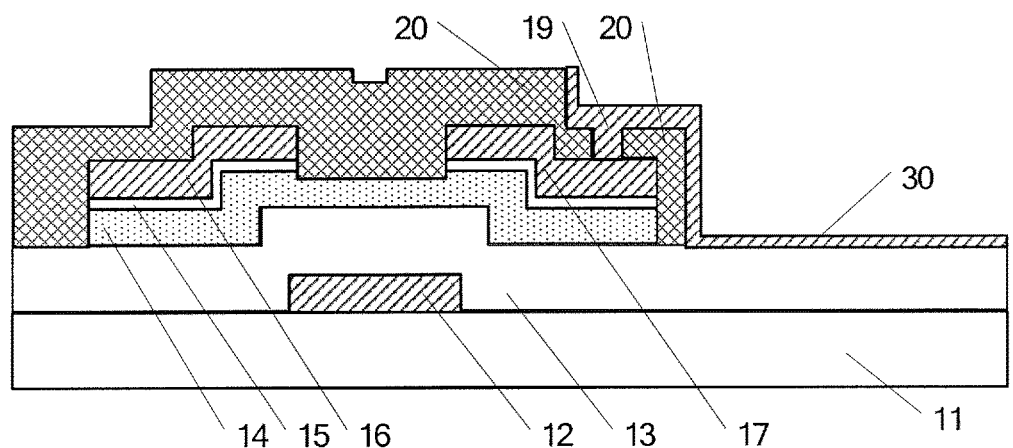

FIG. 3 (a)-FIG. 3 (b) are respectively a plan view and a sectional view illustrating an array substrate according to some embodiments of the disclosure. The array substrate comprises a base substrate 11 and a plurality of gate lines and a plurality of data lines that are formed on the base substrate 11. The plurality of gate lines and the plurality of data lines intersect with each other to define a plurality of pixel units. Each pixel unit comprises a pixel electrode 30 and a thin film transistor. The thin film transistor comprises a gate electrode 12, a gate insulation layer 13, an active layer, a source electrode 16 and a drain electrode 17 that are formed on the base substrate 11. The active layer comprises a semiconductor layer 14 and a doped semiconductor layer 15. A passivation layer 20 is provided on the thin film transistor, and the passivation layer 20 has a via hole 19. The pixel electrode 30 is connected with the drain electrode 17 of the thin film transistor through the via hole 19.

The passivation layer 20 is made of a black insulation material. The passivation layer 20 is provided with an opening at a pixel display region (i.e., a region corresponding to the pixel electrode 30) of the array substrate so that the pixel display region is not covered by the passivation layer 20. The passivation layer 20 covers the gate line, the data line and the thin film transistor.

A relative dielectric constant of the black insulation material is 6-7. An optical density of the passivation layer (i.e. the layer made of the black insulation material) is no less than 4. Further, a thickness of the passivation layer 20 is no less than $$\frac{4}{n} \mu m,$$

where n represents the optical density of the black insulation material with a thickness of 1 micron. In some embodiments, the thickness of the passivation layer is no more than 1 micron.

The black insulation material is high in relative dielectric constant and is high in optical density (OD). The optical density represents a light-shielding ability of a material. The optical density has no unit. The optical density is the logarithm of the ratio between the incident light and the transmission light, or is the logarithm of the reciprocal of light transmittance.

In some embodiments, the black insulation material is a photosensitive resin mixed with black pigment or a thermosetting resin mixed with black pigment.

The passivation layer is made of the black insulation material rather than the conventional material for forming the passivation layer (for example, silicon nitride). The mask plate used for forming the via hole is designed so that the passivation layer covering the gate line, the data line and the thin film transistor is retained, and the passivation layer at the via hole and the passivation layer at the pixel display region are removed. Thus, the passivation layer retained on the array substrate is simultaneously used as a black matrix. Since the black matrix is formed directly on the array substrate, the misalignment in the subsequent bonding process is avoided, and the aperture ratio is ensured. In addition, since the passivation layer is simultaneously used as the black matrix, the fabrication process is simplified so that the fabrication efficiency is improved.

In some embodiments, the thin film transistor of the array substrate has a bottom gate structure. In some embodiments, the thin film transistor of the array substrate has a top gate structure or other modified structures.

According to some embodiments, a display panel is provided. The display panel comprises the array substrate as described above. The display panel further comprises an opposite substrate and a liquid crystal layer provided between the array substrate and the opposite substrate. In some embodiments, the opposite substrate does not comprise the black matrix.

In some embodiments, since the passivation layer of the array substrate is made of the black insulation material and the passivation layer is provided with the opening at the pixel display region, the passivation layer of the array substrate is simultaneously used as the black matrix and the opposite substrate is not provided with the black matrix.

In some embodiments, the display panel is a liquid crystal display panel formed by bonding the array substrate as described above and the opposite substrate provided with the black matrix.

Figure 4:
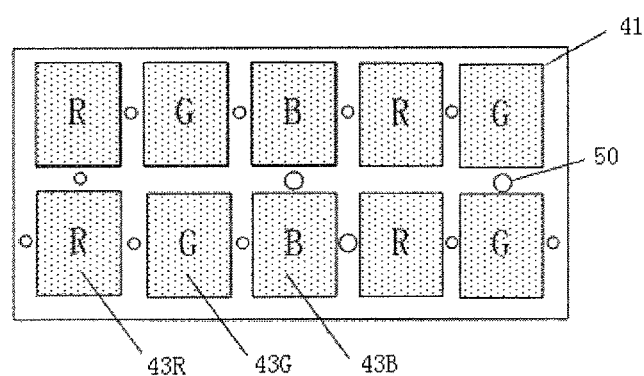
FIG. 4 (a)-FIG. 4 (b) are respectively a plan view and a sectional view illustrating an opposite substrate according to some embodiments of the disclosure.
Figure 4:
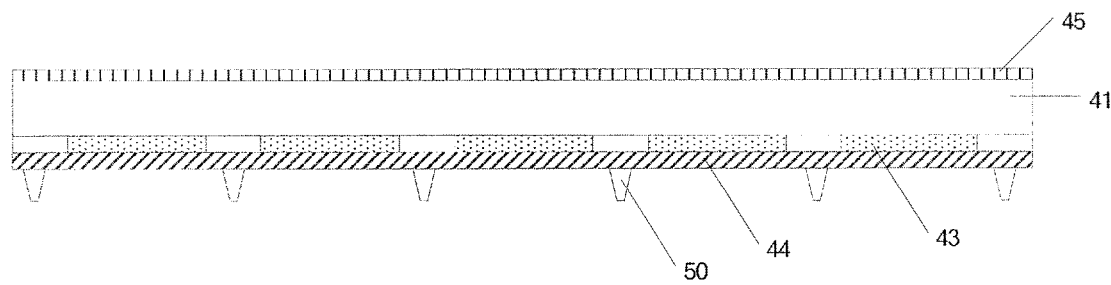

FIG. 4 (a)-FIG. 4 (b) are respectively a plan view and a sectional view illustrating the opposite substrate according to some embodiments. The opposite substrate comprises a base substrate 41, a color filter layer 43 (for example, comprising a red filter unit 43R, a green filter unit 43G and a blue filter unit 43B) and a columnar spacer 50. In some embodiments, an outer surface of the color filter layer 43 is covered with a protective layer 44. In some embodiments, the opposite substrate further comprises a transparent conductive layer 45.

In the TFT-LCD display panel of ADS mode or IPS mode, the transparent conductive layer 45 is provided on a side of the base substrate 41 opposite to the color filter layer 43, so as to serve as a shield electrode layer to shield the interference of the external electric field. In the TFT-LCD display panel of TN mode, the transparent conductive layer 45 is provided on the color filter layer 43 to serve as a common electrode layer. The transparent conductive layer is made of ITO, IZO or other transparent conductive materials. The color filter layer is a matrix of color photoresist.

In some embodiments, the opposite substrate does not comprise the black matrix, and thereby the adverse influence of the segment difference at the pixel corner on the surface evenness of the opposite substrate is eliminated.

FIG. 4 (a)-FIG. 4 (b) illustrate that the color filter layer 43 and the spacer 50 are both formed on the opposite substrate. However, in some embodiments, one or both of the color filter layer 43 and the spacer 50 are formed on the array substrate.

According to some embodiments, a fabrication method of the array substrate is provided. The method comprises the following steps.

S11: forming the thin film transistor, the gate line, and the data line on a base substrate; and S12: forming a black insulation material film on the base substrate after the step S11, and forming the passivation layer by a patterning process. The passivation layer covers the gate line, the data line and the thin film transistor, the passivation layer is provided with the via hole at the drain electrode of the thin film transistor, and the passivation layer is provided with the opening at the pixel display region.

In some embodiments, the step S11 further comprises the following steps.

S101: depositing a gate metal film on the base substrate, and forming the gate electrode and the gate line by a patterning process;

S102: forming the gate insulating layer on the base substrate after the step S102; and S103: depositing a semiconductor thin film, a doped semiconductor thin film and a source-drain metal film on the base substrate after the step S103, and forming the active layer, the data line, the source electrode, the drain electrode and a TFT channel by a patterning process.

Figure 5:
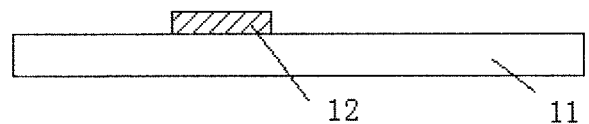
FIG. 5 (a)-FIG. 5 (f) are sectional views illustrating a fabrication method of an array substrate according to some embodiments of the disclosure.
Figure 5:
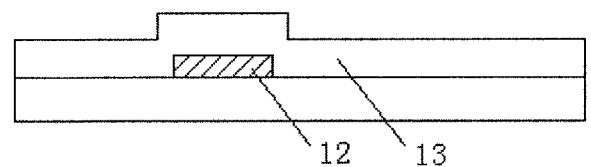
Figure 5:
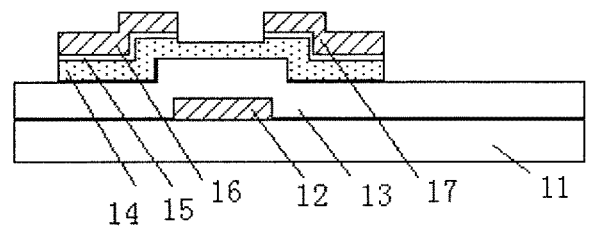
Figure 5:
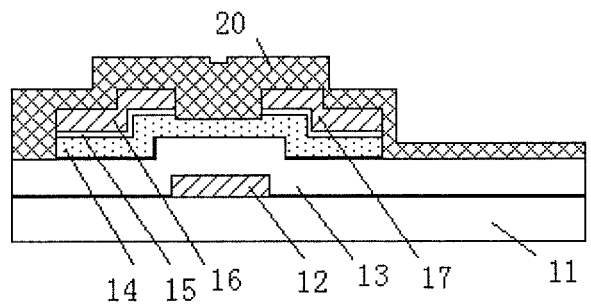
Figure 5:
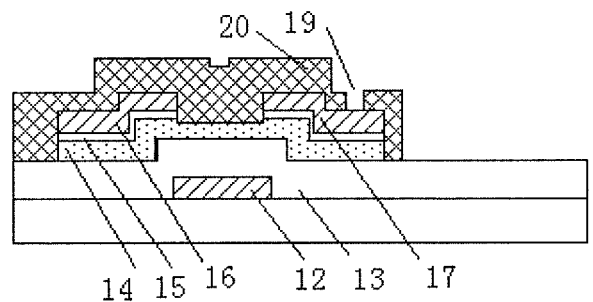
Figure 5:
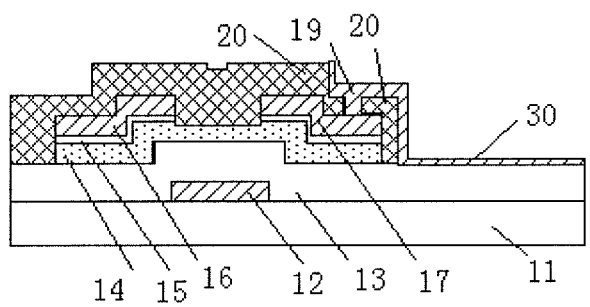

FIG. 5 (a)-FIG. 5 (f) are sectional views illustrating the fabrication method of the array substrate according to some embodiments of the disclosure. FIG. 5 (a) illustrates that the gate electrode 12 is formed on the base substrate. FIG. 5 (b) illustrates that the gate insulation layer 13 is formed. FIG. 5 (c) illustrates that the active layer (comprising the semiconductor layer 14 and the doped semiconductor layer 15), the source electrode 16 and the drain electrode 17 are formed. FIG. 5 (d) illustrates that the passivation layer 20 is formed by using the black insulation material. FIG. 5 (e) illustrates that the passivation layer 20 is provided with the via hole 19 at the drain electrode of the thin film transistor and the passivation layer 20 is provided with the opening at the pixel display region. FIG. 5 (f) illustrates that the pixel electrode layer 30 is formed.

In some embodiments, the relative dielectric constant of the black insulation material is 6-7. The optical density of the passivation layer (i.e. the layer made of the black insulation material) is no less than 4. Further, the thickness of the passivation layer 20 is no less than $$\frac{4}{n}\ \mu m,$$

wherein n represents the optical density of the black insulation material layer with the thickness of 1 micron.

The black matrix in the TFT-LCD panel is fabricated on the array substrate. The passivation layer in the array substrate is made of the black insulation material. Meanwhile, by designing the mask plate, the passivation layer covering the gate line, the data line and the thin film transistor is retained, but the passivation layer covering the pixel display region and the passivation layer at the via hole are removed. In this way, the aperture ratio is effectively improved.

In the fabrication method of the array substrate according to some embodiments, only the material for forming the passivation layer and the mask plate for forming the via hole are changed compared to the conventional method for fabricating the array substrate, without adding any new apparatus or process. The fabrication method of the array substrate according to some embodiments is applied to the TFT-LCD panel of ADS mode, IPS mode, TN mode and the like, and the aperture ratio is effectively improved.

According to some embodiments, a fabrication method of the display panel is provided. The method comprises the fabrication method of the array substrate as described above and a fabrication method of the opposite substrate. In some embodiments, the fabrication method of the opposite substrate comprises the following steps.

S21: forming the color filter layer on the base substrate of the opposite substrate;

S22: forming the protective layer on the base substrate after the step S21;

S23: forming a spacer on the base substrate after the step S22. The spacer is the columnar spacer.

In the TFT-LCD display panel of ADS mode or IPS mode, the fabrication method of the opposite substrate further comprises a step of: forming the transparent conductive layer on the side of the base substrate opposite to the color filter layer. The transparent conductive layer serves as the shield electrode layer to shield the interference of the external electric field.

In the TFT-LCD display panel of TN mode, the fabrication method of the opposite substrate further comprises a step of: forming the transparent conductive layer on the color filter layer. The transparent conductive layer is used as the common electrode layer.

The transparent conductive layer is made of ITO, IZO or other transparent conductive materials. The color filter layer is a matrix of color photoresist.

In some embodiments, the process for forming the black matrix on the opposite substrate is omitted, thus the apparatus investment and production cost are reduced. In addition, the color filter layer is directly formed on the base substrate, and thereby the adverse influence of the segment difference at the pixel corner on the surface evenness of the opposite substrate is eliminated. The fabrication method of the display panel according to some embodiments is applied to the TFT-LCD panel of ADS mode, IPS mode, TN mode and the like.

The foregoing embodiments merely are exemplary embodiments of the disclosure, and not intended to define the scope of the disclosure, and the scope of the disclosure is determined by the appended claims.

What is claimed is:

1. An array substrate, wherein
   a passivation layer of the array substrate is made of a black insulation material and the passivation layer is provided with an opening at a pixel display region of the array substrate,
   the array substrate comprises a thin film transistor provided below the passivation layer and a pixel electrode provided on the passivation layer,
   the passivation layer has a lower surface directly contacting the thin film transistor and an upper surface directly contacting the pixel electrode, and
   a thickness of the passivation layer with its lower surface directly contacting the thin film transistor and its upper surface directly contacting the pixel electrode is no less than $$\frac{4}{n}\ \mu m,$$

where n represents an optical density of the black insulation material with a thickness of 1 micron, and the thickness of the passivation layer with its lower surface directly contacting the thin film transistor and its upper surface directly contacting the pixel electrode is no more than 1 micron.

2. The array substrate according to claim 1, wherein
   the array substrate further comprises a base substrate and a plurality of gate lines and a plurality of data lines that are formed on the base substrate;
   the plurality of gate lines and the plurality of data lines intersect with each other to define a plurality of pixel units;
   each pixel unit comprises the pixel electrode and the thin film transistor; and
   the passivation layer covers the gate line, the data line and the thin film transistor.

3. The array substrate according to claim 1, wherein the optical density of the passivation layer is no less than 4.

4. The array substrate according to claim 3, wherein the optical density is a logarithm of a ratio between a incident light and a transmission light, or is a logarithm of a reciprocal of light transmittance.

5. The array substrate according to claim 1, wherein a relative dielectric constant of the black insulation material is 6-7.

6. A display panel, comprising the array substrate according to claim 1.

7. The display panel according to claim 6, wherein
   the display panel further comprises an opposite substrate and a liquid crystal layer provided between the array substrate and the opposite substrate; and
   the opposite substrate does not comprise a black matrix.

8. The display panel according to claim 7, wherein the opposite substrate comprises a base substrate, a color filter layer and a spacer.

9. The display panel according to claim 8, wherein the opposite substrate comprises a protective layer covering an outer surface of the color filter layer.

10. The display panel according to claim 8, wherein the opposite substrate further comprises a transparent conductive layer, and the transparent conductive layer is provided on a side of the base substrate opposite to the color filter layer so as to serve as a shield electrode layer.

11. The display panel according to claim 8, wherein the opposite substrate further comprises a transparent conductive layer, and the transparent conductive layer is provided on the color filter layer to serve as a common electrode layer.

12. The array substrate according to claim 1, wherein the pixel display region corresponds to the pixel electrode.

13. The array substrate according to claim 1, wherein the passivation layer is provided with a via hole at a drain electrode of the thin film transistor.

14. The array substrate according to claim 1, wherein the passivation layer is simultaneously used as a black matrix.

15. The array substrate according to claim 1, wherein the upper surface of the passivation layer is uneven.

16. A fabrication method of an array substrate, comprising:

forming a thin film transistor on a base substrate;

forming a black insulation material film on the thin film transistor, and forming a passivation layer by performing a patterning process on the black insulation material film; and forming a pixel electrode on the passivation layer, wherein the passivation layer is provided with an opening at a pixel display region, the passivation layer has a lower surface directly contacting the thin film transistor and an upper surface directly contacting the pixel electrode, and a thickness of the passivation layer with its lower surface directly contacting the thin film transistor and its upper surface directly contacting the pixel electrode is no less than $$\frac{4}{n} \mu m,$$

where n represents an optical density of the black insulation material film with a thickness of 1 micron, and the thickness of the passivation layer with its lower surface directly contacting the thin film transistor and its upper surface directly contacting the pixel electrode is no more than 1 micron.

17. The fabrication method of the array substrate according to claim 16, comprising:

forming a gate metal film on the base substrate, and forming a gate electrode and a gate line by performing a patterning process on the gate metal film;

forming a gate insulating layer on the base substrate; and forming a semiconductor thin film, a doped semiconductor thin film and a source-drain metal film on the base substrate, and forming an active layer, a data line, a source electrode and a drain electrode by performing a patterning process on the semiconductor thin film, the doped semiconductor thin film and the source-drain metal film.

18. The fabrication method of the array substrate according to claim 17, wherein the passivation layer covers the gate line, the data line and the thin film transistor, and the passivation layer is provided with a via hole at a drain electrode of the thin film transistor.

\* \* \* \* \*